United States Patent
Matsui et al.

[11] Patent Number: 5,991,360
[45] Date of Patent: Nov. 23, 1999

[54] LASER PLASMA X-RAY SOURCE, SEMICONDUCTOR LITHOGRAPHY APPARATUS USING THE SAME AND A METHOD THEREOF

[75] Inventors: Tetsuya Matsui, Hitachi; Kimio Yamada; Masatsugu Nishi, both of Hitachinaka; Manabu Ueno; Masahiro Tooma, both of Hitachi, all of Japan

[73] Assignee: Hitachi, Ltd., Tokyo, Japan

[21] Appl. No.: 09/018,316

[22] Filed: Feb. 3, 1998

[30] Foreign Application Priority Data

Feb. 7, 1997 [JP] Japan .................................. 9-024731

[51] Int. Cl.$^6$ .................................................. H01J 35/08
[52] U.S. Cl. ............................................ 378/119; 378/143
[58] Field of Search .................................. 378/119, 124, 378/143

[56] References Cited

U.S. PATENT DOCUMENTS

| | | | |
|---|---|---|---|
| 4,538,291 | 8/1985 | Iwamatsu | 378/119 |
| 4,723,262 | 2/1988 | Noda et al. | 378/119 |
| 4,953,191 | 8/1990 | Smither et al. | 378/143 |
| 5,459,771 | 10/1995 | Richardson et al. | 378/119 |
| 5,577,091 | 11/1996 | Richardson et al. | 378/119 |
| 5,577,092 | 11/1996 | Kublak et al. | |

FOREIGN PATENT DOCUMENTS 63-254150  12/1990  Japan .
95/25370   9/1995   WIPO .

OTHER PUBLICATIONS

P. Celliers, XP–002063259 Optimization of x–ray sources for proximity lithography produced by a high average power Nd: glass laser$^{a)}$, J. Appl. Phys. 79 (11), Jun. 1, 1996, pp. 8258–8268.

H. Fiedorowicz, et al, XP 000380906 x–ray emission from laser–irradiated gas puff targets, Appl. phys. Lett. 62 (22), May 31, 1993, pp. 2778–2780.

*Primary Examiner*—David P. Porta
*Attorney, Agent, or Firm*—Antonelli, Terry, Stout & Kraus, LLP

[57] ABSTRACT

A laser plasma X-ray source has an improved X-ray conversion efficiency and a minimized occurrence of debris, and a semiconductor lithography apparatus using the same and a method therefor are provided. An X-ray generation unit has a vacuum chamber 5 which encases the target; target supply unit 110 which supplies a fine particle mixture gas target into the vacuum chamber 5; a laser irradiation unit 120 which irradiates a laser beam 2 on the particle mixture gas target 10; and a target recovery unit 130 which recovers unused particle mixture gas target from the vacuum chamber 5.

11 Claims, 5 Drawing Sheets

LASER PLASMA X-RAY SOURCE, SEMICONDUCTOR LITHOGRAPHY APPARATUS USING THE SAME AND A METHOD THEREOF

FIELD OF THE INVENTION

This invention relates to a laser plasma X-ray source which, by irradiating a laser beam on a target, produces a plasma from which x-rays are generated.

BACKGROUND OF THE INVENTION

JP Laid-open No. 6-281799 discloses that a solid target provided in the shape of a winding tape is irradiated with a laser beam so as to generate X-rays.

JP Laid-open No. 61-153935 discloses that a droplet of liquid metal is irradiated with a laser beam so as to generate X-rays.

JP Laid-open No. 2-100297 discloses that a bullet shaped target having a diameter smaller than a spot diameter of a laser beam is irradiated with a laser beam so as to produce X-rays.

JP Laid-open No. 57-41167 discloses that solidified rare gas or water particles are irradiated with a laser beam so as to produce X-rays.

OSA, Trends in Optics and Photonics, vol. 4, EXTREME ULTRAVIOLET LITHOGRAPHY, 1996, pp. 66- discloses that a pressurized gas is injected into a vacuum chamber, and then the injected gas is irradiated with a laser beam so as to produce X-rays.

When a target is irradiated with a laser beam, atoms and molecules in the target are subjected to optical breakdown so as to be ionized, thereby producing a laser plasma. Then, an X-ray is generated from the laser plasma which has been produced. Depending on the species of elements in the target and the status thereof, the intensity of the laser beam required for the optical breakdown will change. The minimum limit value of laser beam intensity which causes optical breakdown is referred to as the breakdown threshold.

Optical breakdown thresholds become higher in the order of (1) gas, (2) liquid and (3) solid. In other words, the laser beam intensity required for producing a plasma being the same number of atoms can be lowered by using solid and/or liquid targets, rather than by using a gas target. Therefore, in the case where liquid and solid targets are used, the X-ray conversion efficiency (expressed in energy of X-rays generated relative to energy of irradiated laser beam) becomes higher than in the case where a gas target is used.

However, when a solid target in a bulk or a liquid target having a diameter larger than the spot diameter of a laser beam is used, the heat generated in the region of the target irradiated by the laser beam is conducted to its peripheral region, thereby melting the peripheral region thereof. Then, the melted portion is caused to scatter in response to an expansion pressure associated with the production of the laser plasma. This scattered portion, which is called debris, assumes various forms, such as an ionized state, cluster state and a particle of several tens Am in size. This debris attaches to and damages optical elements in the vacuum chamber.

When solid and liquid targets are provided in the form of a particle having a diameter which is smaller than the spot diameter of the laser beam, the amount of debris will be reduced due to absence of particles in the periphery of the irradiated portion, with the same X-ray conversion efficiency being ensured as by using the solid and liquid targets. However, it is very difficult to supply a target in the shape of particles in synchronism with irradiation of a laser beam, and thus, it is difficult to produce X-rays stably.

A target of particles prepared by freezing a chemically stable gas, such as one of the rare gases, will not produce debris when melted, since it turns into a chemically stable gas. However, it is difficult to supply such targets, thereby preventing stable production of X-rays. Further, since the frequencies of its specified X-ray are limited, and if there exists a difference from a desired wavelength, the X-ray conversion efficiency of the target becomes substantially lower than that of a metal target.

On the other hand, when using a gaseous target, since the target has a smaller heat conduction to its peripheral portion as compared to solid and liquid targets, thus not likely causing melting of the peripheral portion, a continuous supply of such a gaseous target can be ensured with minimum debris, thereby being capable of stably producing X-rays. However, since its breakdown threshold is higher, and its atomicity density is lower, its X-ray conversion efficiency is lower than those of the solid and liquid targets.

SUMMARY OF THE INVENTION

The present invention has been contemplated to solve the above-mentioned problems associated with the prior art. The main object of the present invention is to provide a laser plasma X-ray source, which can minimize formation of debris and has an improved X-ray conversion efficiency, and to provide a semiconductor lithography apparatus using the same and a semiconductor lithography method therefor. The feature of the invention for accomplishing the above-mentioned object resides in the fact that a target prepared by mixing particles in a gas, is injected by a target injector into a chamber and a laser irradiation apparatus irradiates the injected target with a laser beam. According to this feature of the invention, since the heat conduction in this target prepared by mixing the particles and the gas is small, thereby preventing melting of particles in the peripheral portion of the target irradiated with a laser beam, formation of debris can be minimized.

Further, the target formed of a mixture of particles and gas is injected as a fluid flow, thereby allowing a constant supply of a target flow for a laser pulse, thereby stably generating X-rays.

Still further, although the volume of the target formed of the mixture of particles and gas through which a laser beam penetrates is the same as that in the case of a gas target alone, its breakdown threshold is the same as in the case of a solid target which, is smaller than the case of a gas target alone. Therefore, the plasma producible region in the case of using such a mixed target becomes greater than the plasma producible region when using a gas target alone, and since a greater number of particles and gaseous molecules are included in the plasma producible region, the number of fine particles undergoing optical breakdown increases as compared to the case of using a particle target or a gaseous target alone. Thereby, the brightness of X-rays which are generated can be increased as compared to the cases where a particle target or gaseous target alone is used.

Thereby, its X-ray conversion efficiency can be substantially improved.

Still further, since there exist more particles and gaseous molecules in the plasma producible region, and since the chance that optical breakdown will not take place is zero, it can be ensured that irradiation of a laser beam will always produce a laser plasma, thereby generating x-rays stably without wasting laser beam energy.

According to another feature of the invention, the diameter of target particles is made smaller than the diameter of the laser beam which irradiates the particles. Thereby, since more particles can exist in the plasma producible region, the brightness of X-rays which have been produced can be increased substantially.

According to still another feature of the invention, the gas, used is a rare gas which is chemically stable. Thereby, even if it adheres to optical elements in the vacuum chamber in an ionic state, it is readily neutralized by combining with electrons, and, as a result, formation of debris is minimized.

According to a still further feature of the invention, the target particle comprises a low melting point metal which can be completely turned into a plasma when irradiated with a laser beam, thereby minimizing formation of debris.

According to still another aspect of the invention, the target is composed of a mixture of metal particles and a rare gas, both having an identical specific X-ray wavelength. According to this feature, since the metal particles and rare gas molecules will emit X-rays having the same wavelength in a plasma, brighter X-rays can be produced than in the case of using a target either of metal particles or a rare gas alone.

According to still another aspect of the invention the features reside in the fact that a target is provided by mixing particles with a gas, a target injector injects the target, a target recovery unit is provided opposite to the target injector to recover unused targets, and a laser irradiation unit irradiates the target present between the injector and the recovery unit with a laser beam, so that particles and gaseous molecules which were not used in the production of plasma and those which are returned to their steady states can be recovered, and the vacuum chamber can be maintained at a low pressure, thereby preventing loss of X-rays which have been produced.

According to still a further aspect of the invention, the feature thereof resides in the fact that the laser irradiation unit has a convergence lens to converge a laser beam into a linear transverse line for irradiating the targets. According to this feature, when the linearly converged laser beam is irradiated on the targets, a cigar-shaped plasma is produced from which higher intensity X-rays can be obtained in the axial direction of the plasma, since more X-rays are emitted in this direction.

According to another aspect of the invention, the features thereof reside in the fact that a convergence mirror is used to direct an X-ray produced by the laser plasma X-ray source of the invention onto a semiconductor mask, and an X-ray reduction exposure mirror is used to reduce an X-ray reflected from the mask and then to project the reduced X-ray onto a semiconductor wafer. According to these features of the invention, since the laser plasma X-ray source of the invention produces less debris, damage to the X-ray optical elements, such as the convergence mirror, mask, X-ray reduction exposure mirror in the semiconductor lithography apparatus and of the vacuum chamber walls, can be prevented. Still further, since a brighter X-ray can be supplied stably from the laser plasma X-ray source of the invention, there occurs no problem due to lack of exposure, and so it becomes possible to shorten a period of time for exposure.

Still further, since the mixture target combining particles and gas according to the invention, which has a small heat conductance, does not form debris upon irradiation by a laser beam even without the use of a target injector, since there occurs no melting of particles in the peripheral portion of the target, it is possible to attain a higher X-ray conversion efficiency than in the cases of using a target of particles alone or a gaseous target alone.

According to the present invention, the following advantages can be accomplished.

The production of debris can be minimized, since unnecessary melting of particles is prevented by the steps of using a particle mixture gas target; injecting the mixture target into the vacuum chamber using a target injector; and irradiating the laser beam on the injected target by the laser irradiation unit. A more improved X-ray conversion efficiency can be obtained compared to the cases of using particle targets or a gaseous target alone. Further, since targets can be supplied continuously to the laser pulses when the particle mixture gas target is used, X-rays can be generated stably. Still further, since a plasma producible region of larger area, which includes a larger number of particles and gaseous molecules therein as compared to the cases of using a gaseous target alone, can be obtained, a larger number of fine particles can be optically broken down, and the brightness of X-rays produced can be improved substantially as compared to the cases of using a particle target or gaseous target alone. Furthermore, a laser plasma can be produced whenever a laser beam is irradiated without wasting laser beam energy to stably produce an X-ray.

By providing a particle mixture gas target including particles each having a smaller diameter than that of the laser beam used to irradiate the target, a larger number of particles can be included in the plasma producible region, thereby improving the brightness of the X-rays being generated.

Since a rare gas is used as the gas component, which rare gas is chemically stable and does not produce debris, the occurrence of debris can be minimized.

Since metallic particles having a low melting point are used, the occurrence of debris can be further reduced.

By provision of a target composed of a mixture of metallic particles and a rare gas, both of which have approximately the same wavelength of specified X-rays, a more intensified brightness X-ray can be obtained.

According to the laser plasma x-ray source of the invention which uses a particle mixture gas target; injects the mixture target using target injector; recovers unused targets by a target recovery unit provided opposite to the target injector; and irradiates the targets present between the injector and the recovery unit using the laser irradiation unit, the inside of the vacuum chamber can be maintained at a low pressure, and loss of X-rays which have been generated can be prevented.

By provision of a convergence lens which converges the laser beams from the laser irradiation unit into a linear transverse shape to irradiate the target so as to produce a cigar-shaped plasma, a more intensified X-ray can be obtained in the direction of the major axis of the cigar-shaped plasma.

By provision of the converging mirror which directs X-rays generated by the laser plasma X-ray source of the first embodiment onto a mask, along with provision of the X-ray reduction lithographic mirror which reduces X-rays reflected from the mask and projects them on a semiconductor wafer, damage to X-ray optical components, such as the converging mirror, mask and X-ray reduction lithographic mirror as well as damage to the wall of the vacuum chamber, can be prevented, since the occurrence of debris in the laser plasma X-ray source is minimized. Still further, since a stable and intensified brightness X-ray can be supplied from the laser plasma X-ray source, the exposure time can be reduced substantially without lack of exposure.

Still more, by irradiation of the laser beam even on a mixture of particles and a gas which are not injected by the target injector, the occurrence of debris can be reduced as well, since the heat conductivity of the particle mixture gas target is low, thereby causing no melting of particles in the peripheral region of the target. Thus, a more improved X-ray conversion efficiency can be obtained as compared to the cases of using a particle target or gas target.

BRIEF DESCRIPTION OF THE DRAWINGS

The features and advantages of the invention will be more clearly understood with reference to the accompanying drawings, wherein.

PREFERRED EMBODIMENTS OF THE INVENTION

The present inventors, by noting the advantages of solid and liquid targets which have a high X-ray conversion efficiency and a high X-ray brightness, and the advantage of a gas target which produces little or no debris, have contemplated to provide a target of fine solid or liquid particles which have a diameter sufficiently smaller than the diameter of a laser beam to be used to irradiate the target. Thus, we have invented an apparatus and method for stably producing X-rays by mixing solid or liquid particles with a gas to form a target, and by supplying this mixture target by injecting it into a vacuum chamber.

Further, the inventors have confirmed by experiments that a mixture target having solid or liquid particles mixed in a gas (hereinafter referred to as a particle mixture gas target) has a breakdown threshold which is the same as that of a solid or fluid even though the particle mixture gas target includes a gas, from which it is discovered that, although slightly smaller compared to a mass or tape-shaped solid or liquid target, this particle mixture gas target has a higher X-ray conversion efficiency compared to a target comprising solid particles alone or liquid particles alone (hereinafter referred to as particle targets), and of a gas target alone (hereinafter referred to as a gas target).

Preferred embodiments of X-ray sources using particle mixture gas targets and semiconductor lithography apparatuses using the same according to the invention will be described in detail in the following.

EMBODIMENT 1

Figure 1:
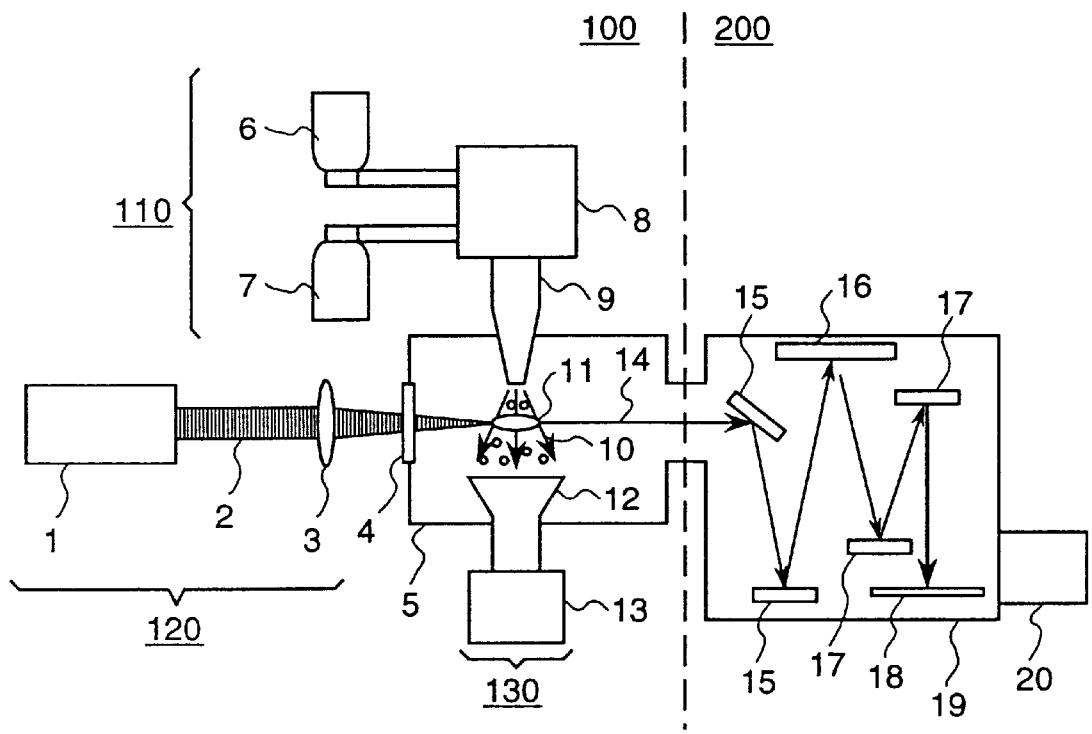
FIG. 1 is a schematic block diagram of a semiconductor lithography apparatus using a laser plasma X-ray source according to a first embodiment of the invention.

With reference to FIG. 1, a semiconductor lithography apparatus using a laser plasma X-ray source representing a first embodiment of the invention is shown. This semiconductor lithography apparatus is comprised of an X-ray generating unit 100 which generates X-rays, and an exposure unit 200. Exposure unit 200 directs X-rays 14 generated in the X-ray generating unit 100 by means of convergence mirror 15 onto a mask 16, and then directs a mask pattern X-ray image reflected from mask 16 onto an X-ray reducing exposure mirror 17 which reduces the mask pattern X-ray image and projects a reduced X-ray mask pattern image on a surface of a wafer 18 (specimen).

X-ray generating unit 100 will be described more in detail. X-ray generating unit 100 according to the invention is comprised of a vacuum chamber 5 which encloses the target flow, a target supply unit 110 which supplies a particle mixture gas as a target flow into vacuum chamber 5, a laser irradiation unit 120 which irradiates the particle mixture gas target 10 with a laser beam 2, and a target recovery unit 130 which recovers unused particle mixture gas from the vacuum chamber 5.

Target supply unit 110 is provided with a particle tank 6 which contains metal particles having a diameter sufficiently smaller than the diameter of the laser beam which irradiates the target, a chemical cylinder 7 which is filled with a rare gas, a mixer 8 which mixes metallic particles supplied from particle tank 6 and the rare gas supplied from the chemical cylinder 7, and a supply nozzle 9 which injects a particle mixture gas formed in mixer 8 into the vacuum chamber 5.

Laser irradiation unit 120 is provided with a laser beam generator 1 which produces laser beam 2, and a condenser lens 3 which converges the laser beam 2. It is preferable for laser beam generator 1 to be able to generate a YAG laser beam or excimer laser beam as the laser beam 2, having a pulse width less than several tens ns and an output per pulse of several tens mJ to several tens J. Laser beam 2 is converged by condenser lens 3 to a diameter of several tens to several hundreds $\mu$m and directed onto the particle mixture gas target in the vacuum chamber 5. In order advantageously to be able to produce laser plasma 11, the energy density on the particle mixture gas target 10 is preferably in a range of $10^{15}$ to $10^{22}$ W/m$^2$.

Target recovery unit 130 is provided with a recovery duct 12 which recovers metal particles and rare gas which have been supplied into vacuum chamber 5 but were not used in the plasma production or have returned to a steady state, and a recovery tank 13 therefor.

Within vacuum chamber 5, an injection port of the supply nozzle 9 is positioned opposite a recovery opening of the recovery duct 12. Laser beam 2 emitted from laser irradiation apparatus 120, passes through a laser beam transmission window 4 provided in the wall of the vacuum chamber 5 and irradiates the particle mixture gas target 10 which has been injected from the supply nozzle 9. The inside of vacuum chamber 5 is maintained at a low pressure by a vacuum pump (which is not shown). For example, assuming that the pressure inside the vacuum chamber 5 is $10^{-2}$ to $10^{-3}$ torr, and the pressure inside supply nozzle 9 is several torr, then particle mixture gas target 10 will be injected into the chamber in a state of fluid flow. Then, the remaining particle mixture gas target 10 which is unused in the plasma formation or has returned to a steady state will be recovered through recovery duct 12 so as to be removed from the vacuum chamber 5.

When a focused laser beam 2 irradiates particle mixture gas target 10, metal elements and rare gas molecules in the particle mixture gas target 10 undergo an optical breakdown so as to become ionized under intense electrical fields due to laser beam 2. Electrons generated in the ionization of the metal elements and rare gas molecules further absorb energy from the laser beam 2 through the process of the inverse bremsstrahlung and the like so as to become heated, thereby producing a high temperature and high density laser plasma 11 in a region through which laser beam 2 has penetrated.

The temperatures and densities of electrons of the laser plasma 11 differ depending on the species of metal particles and rare gases contained in the particle mixture gas target 10, and also depending on the types of lasers and their conditions of use. However, it is preferable if a plasma can be produced which has an electron temperature greater than several hundred eV, and an electron density of approximately $10^{20}$ to $10^{22}/cm^3$.

An X-ray having a continuous spectrum is emitted from laser plasma 11 through the bremsstrahlung process of electrons in laser plasma 11, and by free-free transition and free-bound transition in a recombination process of the plasma. Further, a specificity X-ray is emitted through a bound-bound transition in the recombination process of the plasma. X-rays emitted from laser plasma 11 are utilized in the exposure unit 200 provided adjacent thereto.

A relationship between the number of particles present in the plasma producible region and the generation of X-rays will be described in the following paragraphs.

Figure 2:
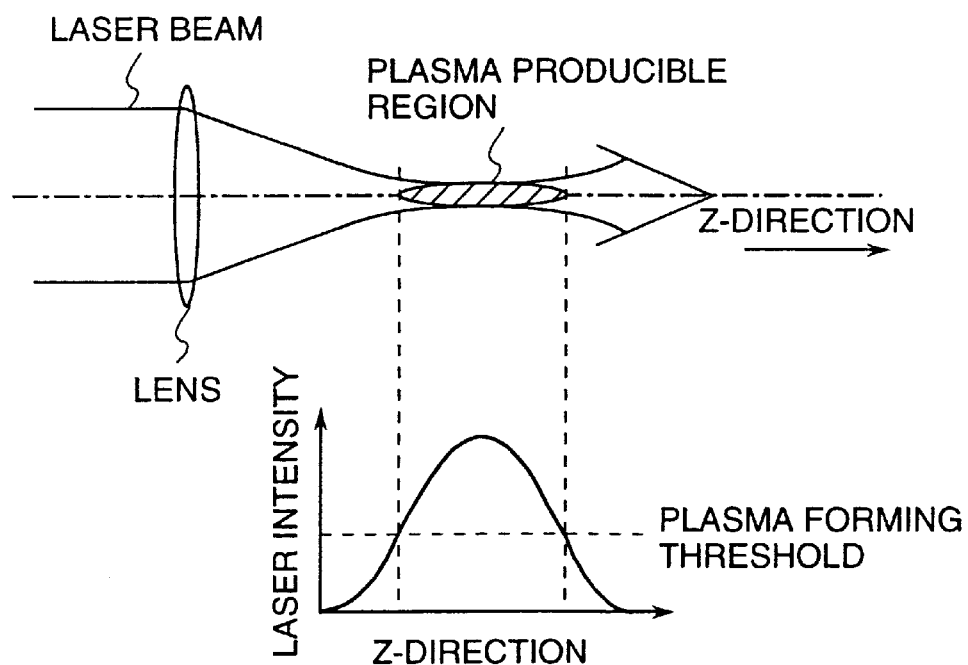
FIG. 2 is a diagram which shows an intensity distribution of a laser beam which is converged.

FIG. 2 shows a relationship of a distribution of laser beam intensities relative to the shape of the laser beam 2 converged by convergence lens 3. The smaller the diameter of the laser beam 2 becomes, the greater the laser beam intensity becomes. In the region of the particle mixture gas target 10 which is penetrated by the laser beam 2, a portion thereof having a laser beam intensity greater than the breakdown, threshold undergoes an optical breakdown thereby producing a laser plasma, while another portion thereof having a laser beam intensity lower than the breakdown threshold will not produce a plasma. This portion where the laser plasma can be generated is referred to as a plasma producible region.

Assuming that the diameter of particles used is sufficiently smaller than the diameter of a cross-section of the conveyed laser beam, the probability that (x) number of particles exist in the plasma producible region is expressed by the following equation according to the Poisson distribution, where the volume of the plasma producible region is V ($m^3$), and the particle density in the particle mixture gas target 10 is n (/$m^3$), $$K(x) = \frac{\alpha^x}{X!} e - \alpha \qquad \text{eq. 1}$$

where $\alpha = nV$.

Therefore, by obtaining the volume V of the plasma producible region which is determined by the breakdown threshold of the particles used and substituting the same in equation 1 above, and by varying the particle density (n) of the particle mixture gas, it becomes possible at a probability of K(x) to set the number of particles present in the plasma producible region at a desired value.

Now, the relationship between the number of particles present in the plasma producible region when particle mixture gas target 10 is irradiated with laser beam 2 to produce laser plasma 11, and the number of particles which undergo optical breakdown will be described in the following. In our experiments, a second harmonic (532 nm wavelength) of a YAG laser was used as laser beam 2 which has an output power of 100 mJ/pulse (10 ns pulse width), and the diameter of the laser convergence cross-section was set approximately at 10 $\mu$m. As its particle mixture gas, particles having a diameter of 0.5 $\mu$m and a rare gas were used.

Figure 3A:
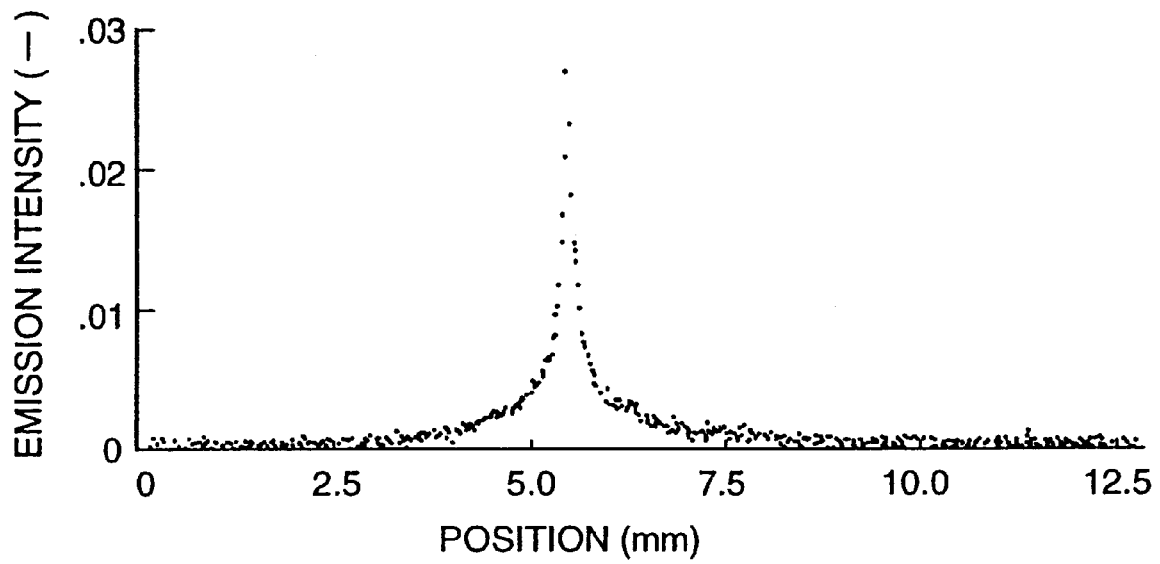
FIG. 3(a) and FIG. 3(b) are graphs which show a result of measurements of a luminous intensity distribution of visual light when a laser plasma is formed.
Figure 3B:
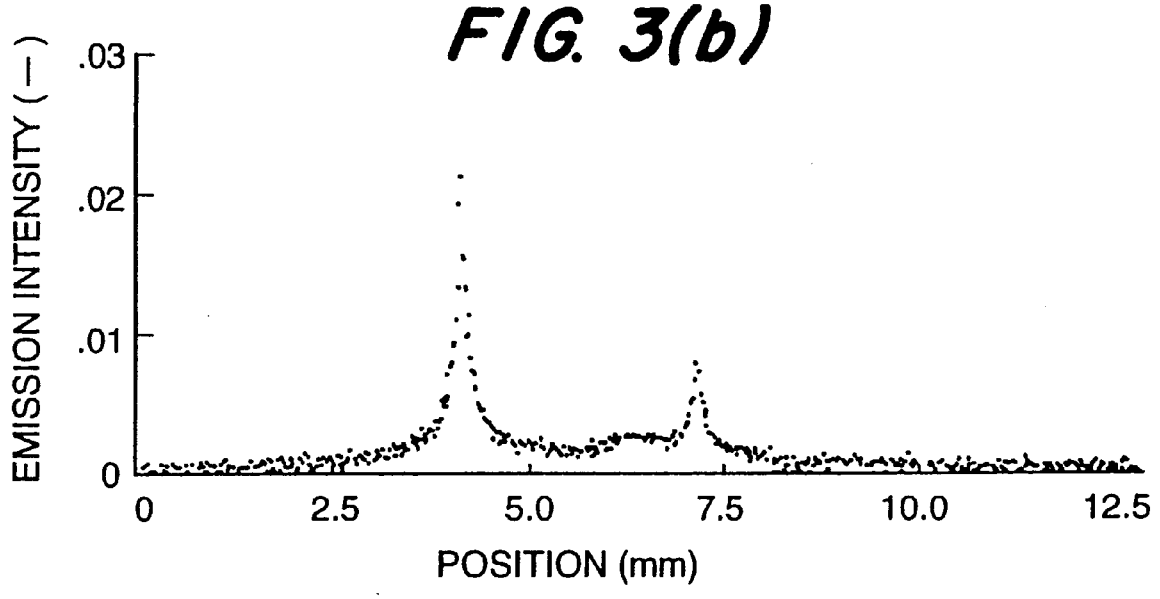

FIGS. 3(a) and 3(b) show results of measurements of luminance intensity distributions of visual light obtained when a laser plasma was formed by irradiating one pulse laser beam in a direction of laser irradiation (in the direction z in FIG. 2). When the particles (metal particles and rare gas) are ionized to form a plasma and emit a high intensity light, namely, when the particles undergo optical breakdown, it is measured as a peak of the luminance intensity. By way of example, when there exists one such particle which was optically broken down in the plasma producible region, one peak appears, as indicated in FIG. 3(a), and when there exist two such particles which were optically broken down, there appear two peaks, as indicated in FIG. 3(b).

Figure 4A:
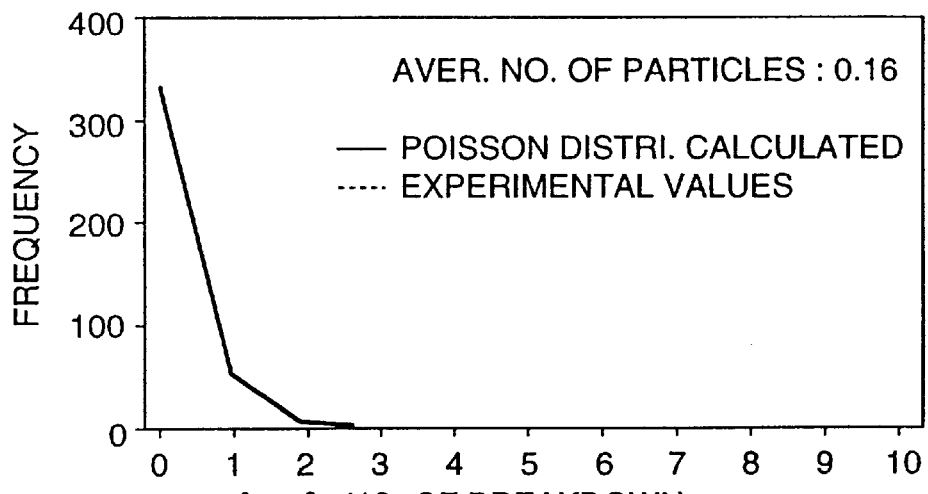
FIG. 4(a), FIG. 4(b) and FIG. 4(c) are graphs which show frequency distributions of the numbers of breakdowns which have occurred in a plasma producible region.
Figure 4B:
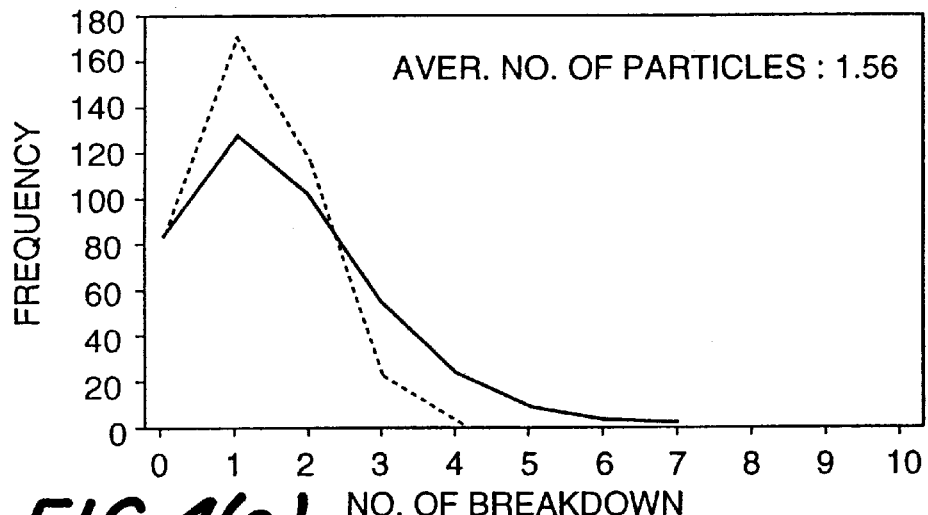
Figure 4C:
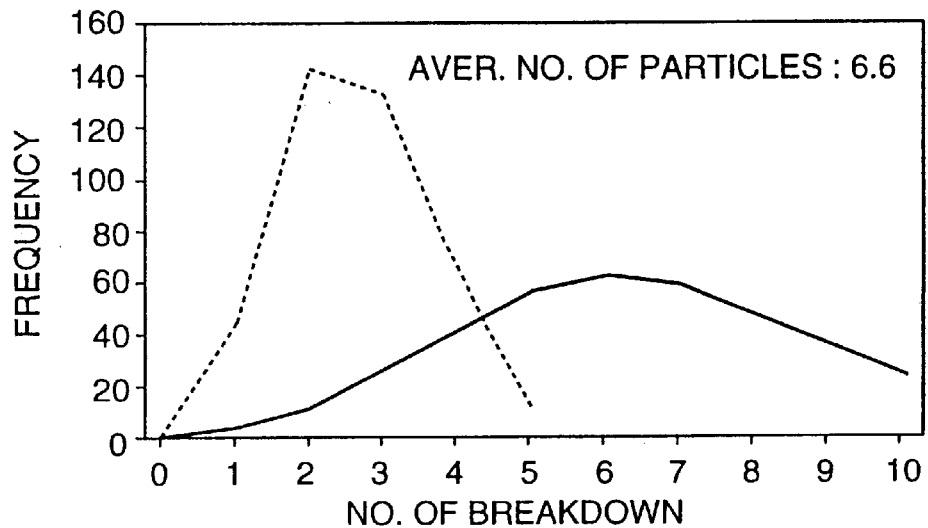

Frequency distributions of the number of the particles (experimental result) which were optically broken down when a one pulse laser was irradiated to produce the laser plasma, and frequency distributions of the number of the particles which were calculated to have been optically broken down using the Poisson's distribution are compared in FIGS. 4(a), 4(b) and 4(c) for each average number of particles ($\alpha$) in the plasma producible region.

When an average number of particles ($\alpha$) is approximately at 1.5 or less, calculated values and experimental values are found to agree with one another, as seen in FIG. 4(a), thereby verifying that the particles present in the plasma producible region are optically broken down in accordance with the theory. Further, in this case, the frequency of a status in which no laser plasma is generated upon laser beam irradiation (i.e., a status of zero breakdown) is observed to be high.

On the other hand, when the average number of particles ($\alpha$) is 6.6, the frequency distribution of the experimental values is shifted greatly from that of the calculated values, as seen in FIG. 4(c). Namely, the number of particles having been optically broken down experimentally obtained is smaller than the calculated value. This is considered to be due to the fact that, since the particles which have been optically broken down are allowed to absorb the laser beam energy, when many particles are optically broken down, there occurs a shortage in the laser beam intensity, thereby preventing more particles from being optically broken down. However, by further increasing the laser beam intensity, the number of particles to be optically broken down can be increased.

In addition, in the case described above, since the chance of that no optical breakdown takes place (i.e., the possibility that the number of particles which are optically broken down is zero) is none, formation of a laser plasma is always ensured upon irradiation of the laser beam. Therefore, the conditions of this case are rather preferable for stably generating X-rays without wasting any laser beam energy.

According to this first embodiment of the invention, the following advantages can be achieved.

According to this embodiment of the invention, in which a particle mixture gas target is used which includes metal particles having a diameter smaller than the diameter of the focused laser beam and a rare gas, an improved X-ray conversion efficiency higher than that obtained by using a metal particle target alone or rare gas target alone is achieved.

Since the particle mixture gas target of the invention has a smaller heat conduction, melting of the metal particles in the peripheral portion of the laser irradiated region hardly occurs, and since the rare gas molecules do not turn into debris, formation of debris can be minimized.

Although the volume of the particle mixture gas target which is penetrated by a laser beam is the same as the volume of the rare gas target which is penetrated by the same laser beam, since the breakdown threshold of the particle mixture gas target which is the same as that of the solid metal target is lower than that of the gaseous target, its plasma producible region is larger than that of the gaseous target. Further, since more metal particles and rare gas molecules are contained in this plasma producible region, the number of particles subject to optical breakdown increases as compared to the cases of using a metal particle target alone and a rare gas target alone, thereby substantially increasing the luminance of the X-rays which are generated.

Still further, since more particles are contained in the plasma producible region, the chance that no optical breakdown takes place is zero. Thereby, whenever a laser beam is irradiated, production of a laser plasma is always ensured, thereby stably generating X-rays without wasting any laser beam energy.

According to this embodiment of the invention, since the particle mixture gas target provided by mixing metal fine particles and rare gas is injected into the vacuum chamber 5 in the form of a fluid flow, and a laser beam is irradiated on the injected fluid flow of particle mixture gas target, the targets can be supplied without interruption, thereby ensuring that X-rays will be generated stably.

According to still another feature of the invention, since unused targets which were not used in the generation of the plasma are recovered, the inside of the vacuum chamber 5 can be maintained at a low pressure, thereby preventing absorption of X-rays by the gases present in vacuum chamber 5 so that loss of X-rays which have been generated can be prevented.

Although metal particles were used in this embodiment of the invention, the invention is not limited thereto, and any materials other than metals which can be turned into a plasma to produce X-rays can be used. Further, if low melting point particles are used, since they can be fully atomized in the plasma producible region, formation of debris can be suppressed.

Further, it is preferable for the solid or liquid particles and for the gas for use in the particle mixture gas target to select species of elements which generate the same specificity X-rays having the same wavelength as that of desired X-rays. In the laser plasma, since materials can be ionized up to an extremely high valence, specificity X-rays not only of K or L shells, but also of M shell or more can be generated. For example, if fine particles of elements, such as Sn or Sb, are used, since Sn or Sb has a specificity X-ray in the vicinity of 13 nm as for its M shell, an X-ray in proximity to 13 nm in the soft X-ray region can be obtained. Further, if Xe is used as the gas which emits a specificity X-ray in proximity to 13 nm, an X-ray in proximity to 13 nm can be obtained. If a target which is prepared by mixing fine particles of an element, such as Sn or Sb, with Xe gas is used, an X-ray in the vicinity of 13 nm which has a brighter luminance compared to the other targets, which include only either one of the above two, can be obtained.

EMBODIMENT 2

Figure 5:
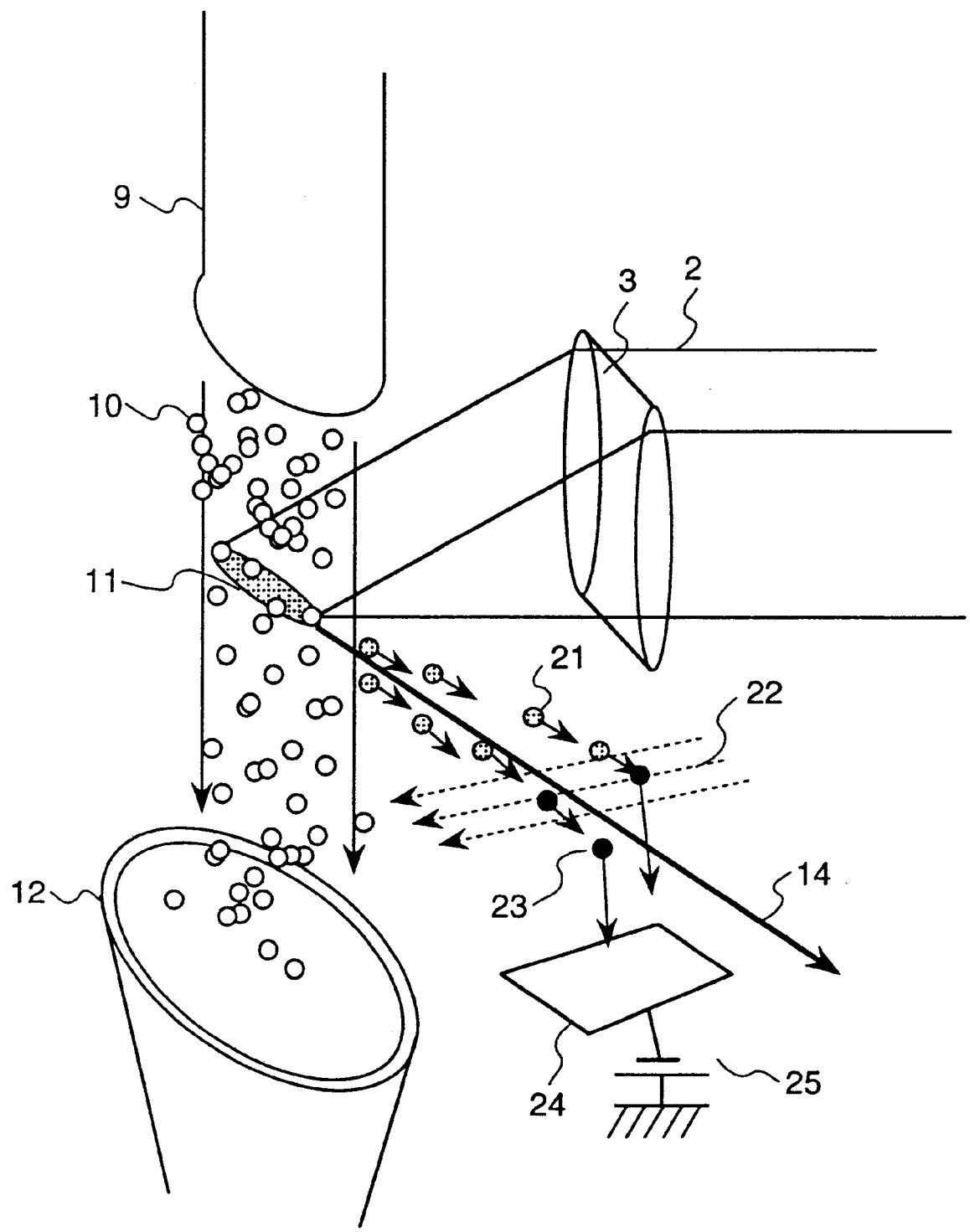
FIG. 5 is a schematic diagram of a laser plasma X-ray source according to a second embodiment of the invention.

A second embodiment of the invention will be described with reference to FIG. 5. The features of this second embodiment reside in the fact that it adds a directivity of emission to the X-rays produced in the first embodiment, and that a debris recovery unit is provided for recovering debris which is scattered in the direction of the emission of X-rays.

In the same manner as in the first embodiment, a fine particle mixture gas injected into a vacuum chamber (not shown) from supply nozzle 9 is irradiated with laser beam 2, which is converged in a direction transverse to the flow of the mixture gas by a convergence lens 3 so as to generate X-rays. In this second embodiment of the invention, the convergence lens 3 which converges the laser beam 2 into a linear shape is used. An electron gun (not shown) is provided outside the vacuum chamber for irradiating an electron beam 22 on X-rays which have been emitted through a window (not shown) of the vacuum chamber, and an ion recovery electrode 24, which is supplied with a negative voltage, is provided in the vicinity of the X-rays being generated.

When laser beam 2, which was converged into a linear shape in a direction transverse to its flow, is irradiated on fine particle mixture gas target 10, a cigar-shaped laser plasma 11 is generated and more X-rays 14 are emitted in the direction of a major axis of the laser plasma 11. By providing a directivity of emission to the X-rays, a more intense X-ray beam can be obtained.

When irradiated with electron beam 22, debris 21 in the form of particles or atoms which have been scattered in the direction of the major axis are positively-ionized. Positively ionized debris 21 is then attracted by ion recovery electrode 24 so as to be completely recovered. This recovery electrode 24 also can recover other scattered debris which has been ionized in the process of plasma production. Thereby, debris 21 from an outlet (not shown) of X-rays can be substantially reduced, thereby preventing damage to X-ray optical elements and the wall of the vacuum chamber.

Also, it can be arranged that, instead of the recovery electrode 24, which recovers ionized debris 21 by means of an electrical field, the orbit of the ionized debris can be changed by a magnetic field so that debris 21 can be prevented from passing into the outlet for the X-rays.

EMBODIMENT 3

Figure 6:
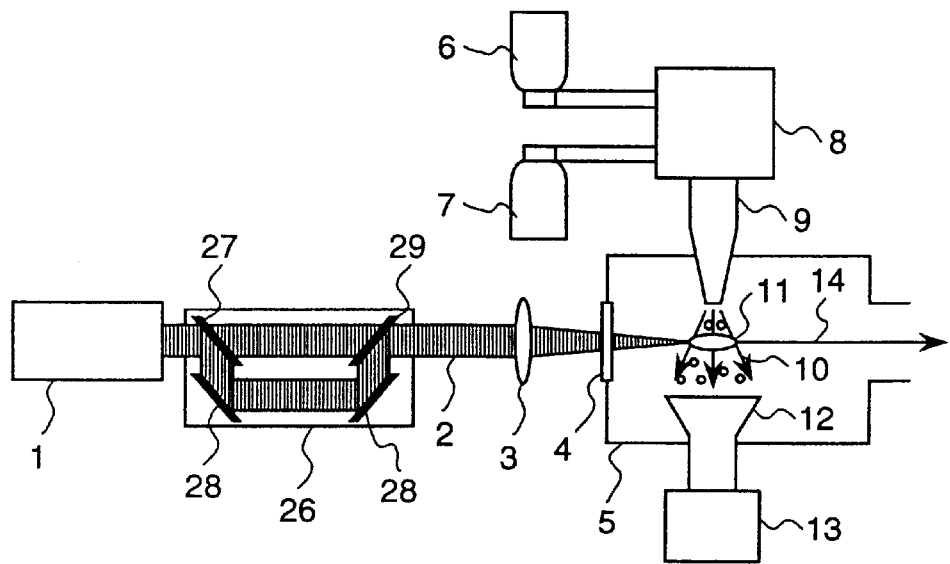
FIG. 6 is a schematic diagram of a laser plasma X-ray source according to a third embodiment of the invention.

A third embodiment of the invention will be described with reference to FIG. 6. This embodiment represents an example of a laser beam plasma X-ray source using a fine particle mixture gas according to the invention, in which laser beam 2 is irradiated as two different pulses having a difference in time of emission.

As a means for producing and irradiating two pulses which are different in time sequence, a laser beam splitter delay optical system 26 is used. This laser beam splitter delay optical system 26 includes a beam splitter 27 which splits a laser beam from laser generator 1 into two parts, a mirror 28 which functions to lengthen an optical path of a splitted laser beam relative to that of the non-splitted laser beam, and a beam mixer 29 which synthesizes the two laser beams into one laser beam 2. Pulses of these two laser beams are caused to delay the times of irradiation in proportion to a difference between their optical paths.

A first pulse irradiated on fine particle mixture gas target 10 produces laser plasma 11. Then, a second pulse is used to heat laser plasma 11, thereby improving the efficiency of X-ray generation. Further, since fine particles which have been unable fully to fission into atomic states by the first pulse are heated further by the second pulse so as to completely fission, with the result that occurrence of particle debris in the plasma producible region can be minimized.

Further, in order to accomplish the advantage of the third embodiment of the invention, one is not limited to the use of the laser beam splitter delay optical system 26, but two laser generators 1 can be used as well to produce the same effect.

According to the third embodiment of the invention, there are such advantages that an higher X-ray generation efficiency can be obtained, and that occurrence of particle debris can be suppressed.

EMBODIMENT 4

Figure 7:
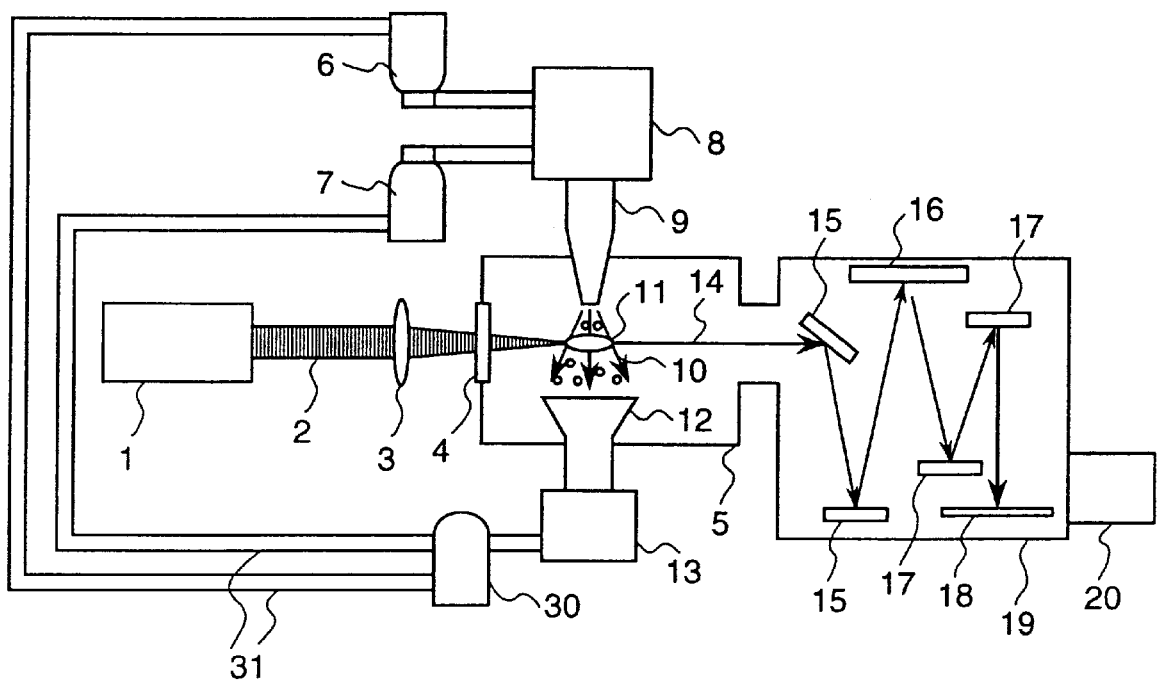
FIG. 7 is a schematic diagram of a semiconductor lithography apparatus using the laser plasma X-ray source according to a fourth embodiment of the invention.

A fourth embodiment of the invention will be described with reference to FIG. 7. According to this fourth embodiment of the invention, a separator 30 for separating metal fine particles and rare gas is provided for the target recovery unit 113 of the first embodiment of the invention for returning separated fine particles and rare gas to the original particle tank 6 and gas cylinder 7 for recycling.

Thereby, according to this fourth embodiment of the invention, there are such advantages that maintenance of the equipment can be reduced substantially, and that a running cost using a costly rare gas, such as Xe gas, can be reduced substantially.

What is claimed is:

1. A laser plasma X-ray source for generating an X-ray from a plasma which is produced by irradiating a laser beam on a target, comprising:

a mixture of particles and a gas serving as said target;

a target injector for injecting said target into a vacuum chamber; and a laser beam irradiation unit for irradiating said laser beam on said target having been injected.

2. A laser beam X-ray source according to claim 1, wherein said particles have a diameter which is smaller than a diameter of the laser beam irradiated on said target.

3. A laser beam X-ray source according to claim 1, wherein said gas is a rare gas.

4. A laser beam X-ray source according to claim 1, wherein said particles are made of a metal having a low melting point.

5. A laser beam X-ray source according to claim 1, wherein said target comprises a mixture of metallic particles and a rare gas both of which have substantially the same wavelength in their specificity X-rays.

6. A laser plasma X-ray source for generating an X-ray from a plasma which is produced by irradiating a laser beam on a target, comprising:

a mixture of particles and a gas serving as said target;

a target injector for injecting said target into a vacuum chamber;

a recovery port provided opposite to said target injector for recovering said target; and a laser irradiation unit for irradiating said target with said laser beam; wherein a laser irradiation unit irradiates said laser beam on said target between said injector and said recovery unit.

7. A laser plasma X-ray source according to claim 1, wherein said laser irradiation unit comprises a converging lens which converges said laser beam into a linear line which is transverse to a flow of said target.

8. A semiconductor lithography apparatus comprising:

a laser plasma X-ray source according to claim 1;

a converging mirror which directs X-rays generated in said laser plasma X-ray source onto a mask; and an X-ray reduction exposure mirror which reduces X-rays reflected from said mask and projects the reduced X-rays on a semiconductor wafer.

9. A semiconductor lithography method for producing a plasma by irradiating a laser beam on a target, generating X-rays from said plasma, and directing said X-rays which have been generated to a semiconductor wafer to expose a semiconductor device pattern on said semiconductor wafer, comprising the steps of:

mixing particles and a gas;

injecting a mixture of said particles and said gas into a vacuum chamber; and irradiating a laser beam on a target formed of said mixture of the particles and the gas.

10. A laser plasma X-ray source for generating X-rays from a plasma which is produced by irradiating a laser beam on a target, wherein said target comprises a mixture of particles and a gas.

11. A semiconductor lithography method for producing a plasma by irradiating a laser beam on a target, generating X-rays from said plasma, and directing said X-rays which have been generated to a semiconductor wafer so as to expose a semiconductor device pattern on said semiconductor wafer, comprising the steps of:

mixing particles and a gas; and irradiating the laser beam on a target formed of the mixture of said particles and said gas.

* * * * *